(12) United States Patent
Devine et al.

(10) Patent No.: US 7,459,403 B1
(45) Date of Patent: Dec. 2, 2008

(54) METHOD FOR REDUCING DEVICE AND CIRCUIT SENSITIVITY TO ELECTRICAL STRESS AND RADIATION INDUCED AGING

(75) Inventors: Roderick A. B. Devine, Albuquerque, NM (US); Harold L. Hughes, West River, MD (US); Akos G. Revesz, Bethesda, MD (US)

(73) Assignee: The United States of America as represented by the Secretary of the Air Force, Washington, DC (US)

( * ) Notice: Subject to any disclaimer, the term of this patent is extended or adjusted under 35 U.S.C. 154(b) by 147 days.

(21) Appl. No.: 11/380,974

(22) Filed: May 1, 2006

(51) Int. Cl.
  *H01L 21/469* (2006.01)
(52) U.S. Cl. ...................... 438/778; 438/798
(58) Field of Classification Search ................ 438/763, 438/765, 776, 778, 792, 798, 795; 148/DIG. 112, 148/DIG. 114, DIG. 81, DIG. 82
See application file for complete search history.

(56) References Cited

U.S. PATENT DOCUMENTS 6,265,327 B1 * 7/2001 Kobayashi et al. .......... 438/776
6,444,533 B1 * 9/2002 Lyding et al. ............... 438/308
6,544,908 B1 * 4/2003 Weimer et al. .............. 438/798
6,949,433 B1 * 9/2005 Hidehiko et al. ............ 438/261

OTHER PUBLICATIONS

D. J. DiMaria, Defect generation in field-effect transistors under channel-hot-electron stress,: J. Appl. Phys. 87 8707-8715 (2000).
J. H. Stathis, "Reliability limits for the gate insulator in CMOS technology," IBM J. Res & Dev. 64 265-286 (2002).
D. J. DiMaria and J. H. Stathis,"Anode hole injection, defect generation and breakdown in ultra-thin silicon dioxide films," J. Appl. Phys. 89 5015-5024 (2001).
S. Zafar et al, "Negative bias temperature instability, charge trapping and high k dielectric stacks" 6th Annual Topical Conference on Reliability, Austin, Tx (2003).
D. Brown and N. S. Saks, Time dependence of radiation-induced interface trap formation in metal-oxide-semiconductor devices as a function of oxide thickness and applied field, unknown date.
J. E. Shelby, "Handbook of Gas Diffusion in Solids and Melts", ASM International, 1996.

* cited by examiner

*Primary Examiner*—Brook Kebede
(74) *Attorney, Agent, or Firm*—Kenneth E. Callahan

(57) ABSTRACT

In microelectronic circuits involving dielectric/semiconductor interfaces having interstitial sites in the dielectric, a method for hardening these interfaces by introducing a small atomic diameter inert gas into the interstitial sites.

6 Claims, 1 Drawing Sheet

(Prior Art)

METHOD FOR REDUCING DEVICE AND CIRCUIT SENSITIVITY TO ELECTRICAL STRESS AND RADIATION INDUCED AGING

STATEMENT OF GOVERNMENT INTEREST

The conditions under which this invention was made are such as to entitle the Government of the United States under paragraph I(a) of Executive Order 10096, as represented by the Secretary of the Air Force, to the entire right, title and interest therein, including foreign rights.

BACKGROUND OF THE INVENTION

The present invention is generally related to methods for enhancing the reliability of microelectronic circuits, and in particular, to minimizing induced aging from both electrical stress and radiation on devices and circuits due to the atomic mismatch at the interface of semiconductor/dielectric materials.

A variety of physical phenomena contributes to the degradation of the fundamental electronic devices making up microelectronic circuits. One of the basic devices in any microelectronic circuit is a field effect transistor (FET). It will be used here to illustrate the degradation problem. The primary mechanism of degradation of FET characteristics, such as drift of the threshold voltage and reduction in the channel carrier transconductance, involves the semiconductor/dielectric interface.

FIG. 1 is schematic diagram of a field effect transistor. The essential elements of the basic device include the gate electrode, the dielectric, the underlying semiconductor layer, and spacers. The gate electrode is usually comprised of heavily doped polycrystalline silicon or, increasingly of a metal or metallic alloy. The dielectric is normally a nitrided $SiO_2$ or an oxy-nitride, but is increasingly replaced by a higher permittivity dielectric such as $Hf_xSi_{1-x}O_2$ or $Hf_xSi_{1-x}O_pN_q$. The underlying semiconductor layer is usually Si or a SiGe mixture in which the active layer enables formation of the inversion layer between the source and drain contacts required for transistor operation. The spacers are usually formed of $SiO_2$ or $Si_3N_4$ and enable the formation of graded source/drain contacts required to engineer the electric fields present in the immediate vicinity of the contacts.

In the usual manner, application of the appropriate potential to the gate electrode results in the formation of an inversion layer in a channel between the source and drain contacts under the dielectric. The quality of the interface between the dielectric and the semiconductor will dictate both the threshold voltage at which the device can be "turned on" and the intensity of the current which flows in the inversion layer between the source and drain contacts.

Elsewhere in the circuit will be more dielectric layers and these may be in contact with the semiconductor surface also. These dielectric layers are typically used for inter-device isolation. Inasmuch as the interfacial region under these dielectrics can lead to parasitic device/device coupling or leakage current, they are also important in the process of circuit aging.

The primary mechanism of degradation of FET characteristics, such as drift of the threshold voltage and reduction in the channel carrier transconductance, involves the semiconductor/dielectric interface (FIG. 1). Because of the atomic network mismatch between the material of the semiconductor and the material of the dielectric, the presently manufactured devices contain large numbers of dangling bonds at this interface. These electrically active bonding defects contribute to the parameters defining the threshold voltage and carrier mobility in the inversion channel. In order to passivate these interfacial defects an annealing is typically carried out in an atmosphere containing a partial pressure of hydrogen or a hydrogen isotope. Symbolically this process can be represented as:

$$\equiv X^{\cdot} + H^2 \rightarrow X-H + H\uparrow \qquad (1)$$

where $\equiv X^{\cdot}$ symbolizes the semiconductor with associated "dangling" bond and $H\uparrow$ represents a hydrogen (or hydrogen isotope) species released by cracking of the basic $H_2$ molecule. The hydrogen or hydrogen isotope may be present in the device either by deliberate addition in the form of so called forming gas or be present as a result of the processing steps used in basic device manufacture (OH groups due to humidity, $SiH_4$ used in the deposition of $SiO_2$ or amorphous Si, etc).

Aging of devices under electrical stressing or even as a result of irradiation occurs by a form of reverse process of Eq. 1 which results in the appearance of the electrically active defect, $\equiv X^{\cdot}$:

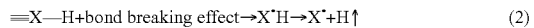

$$\equiv X-H + \text{bond breaking effect} \rightarrow X^{\cdot}H \rightarrow X^{\cdot} + H\uparrow \qquad (2)$$

The escaping hydrogenous species diffuses away either through the dielectric film or into the semiconductor. In the former case, two $H\uparrow$ species will ultimately encounter and dimerize to form the hydrogenous molecule. Typical reactions resulting in bond breaking are hot electron stressing (D. J. DiMaria, "Defect generation in field-effect transistors under channel-hot-electron stress: J. Appl. Phys. 87 8707-8715 (2000) and J. H. Stathis, "Reliability limits for the gate insulator in CMOS technology," IBM J. Res & Dev. 64 265-286 (2002)), Fowler-Nordheim electron injection from the gate electrode (D. J. DiMaria and J. H. Stathis, "Anode hole injection, defect generation and breakdown in ultra-thin silicon dioxide films," J. Appl. Phys. 89 5015-5024 (2001)), and negative bias temperature instability (S. Zafar et al, "Negative bias temperature instability, charge trapping and high k dielectric stacks" 6th Annual Topical Conference on Reliability, Austin, Tx (2003)) These are the most common reactions in device aging.

In specific applications, for example in space, one must also take account of the possible interaction of radiation in breaking bonds (as in DiMaria 87). In this case, the radiation can either break the bond directly or via the generation of protons in the dielectric above the semiconductor active layer with subsequent diffusion (D. Brown and N. S. Saks, "Time dependence of radiation-induced interface trap formation in metal-oxide-semiconductor devices as a function of oxide thickness and applied field" J. Appl. Phys. 70 3734-3747 (1991)) to the interface followed by bond breaking and the formation of H2 as defined in Eq. 2.

Furthermore, elsewhere in microelectronics circuits, dielectrics other than the so called gate dielectric are used (for example, in inter-device isolation) and these may incorporate hydrogenous species (e.g. in Si—OH bonds). Radiation induced bond breakage can result in the formation of H or $H^+$ species which can diffuse through the dielectric network and have a deleterious effect when they arrive at a semiconductor/dielectric interface.

As technology is being scaled to smaller and smaller dimensions, it is becoming increasingly evident that the electrically induced degradation effects are significantly more relevant. As an example, higher power consumption resulting in increased temperature of operation of the device is leading to revived importance of the negative bias temperature instability mechanism which was less important when operational temperatures were lower.

A means of reducing the degradation effects, whether resulting from electrical stressing or radiation is clearly essential for future technologies. Conventionally, aging resulting from electrical stressing was reduced by a) lower operation voltages (lower electric fields across the dielectric) for Fowler-Nordheim injection from the gate electrode; b) careful design of the drain electrode geometry to reduce hot carrier injection (reduction of hot carrier stressing); and c) operational temperature reduction (reduced negative bias temperature instability).

In conventional microelectronics technology, reduction of the effects of electrically active interfacial defects at the dielectric/semiconductor interface is performed by passivation using a hydrogenous species such as H or D. This level of device "hardening" to aging is already performed as standard. However, this hardening is proving inadequate and a new mechanism must be found to improve the reliability lifetime of devices.

The present invention describes a new method of hardening by reducing the probability that conventional de-passivation can occur or, if it occurs, increasing the probability that re-passivation of the de-passivated interface is likely.

DESCRIPTION OF THE PREFERRED EMBODIMENT

Figure 1:
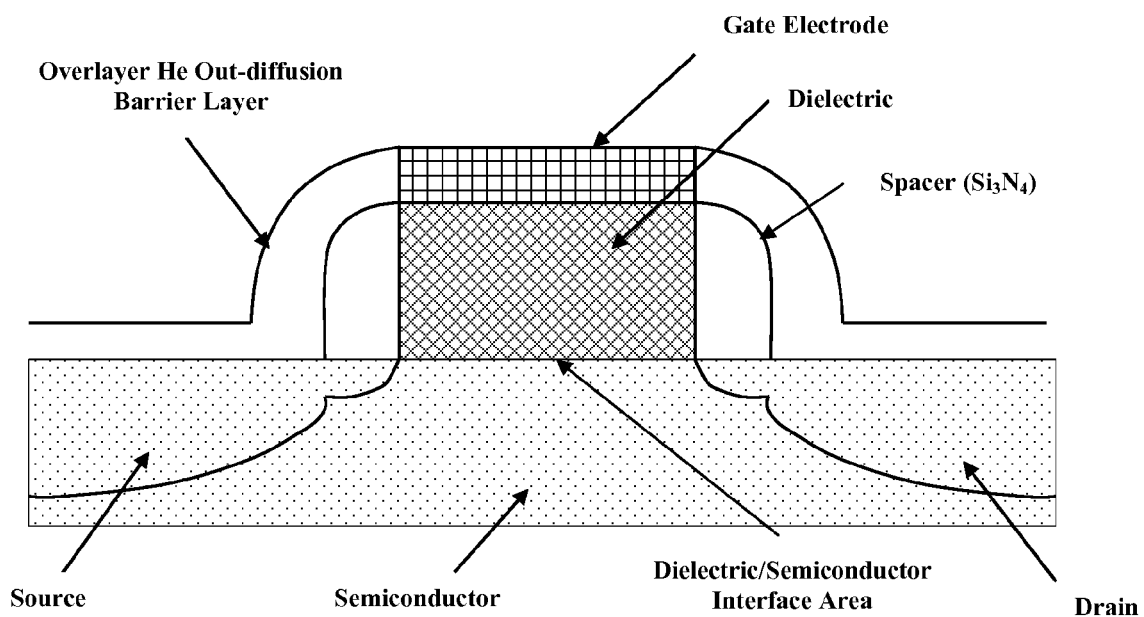
FIG. 1 is a schematic diagram of a field effect transistor.

The mechanisms of aging of the dielectric/semiconductor interface involve de-passivation of the semiconductor-hydrogenous species bond followed by diffusion of the hydrogenous species away from the interface. In the case of irradiation, the fracture of Si—OH bonds and diffusion of H or $H^+$ species through the dielectric network is of primary concern. In both processes involving release of the hydrogenous species it is clear that within some finite time the hydrogenous species must diffuse outside of a "capture radius." Failing this the species could be re-trapped at the semiconductor ion/atom from which it has escaped. Clearly, if a physical mechanism can be found to reduce the probability that the hydrogenous species can escape the capture radius then the aging mechanism will be suppressed.

The present invention relies upon the observation that the structure of the dielectric contains substantial densities of interstitial voids and channels through which gases can diffuse (J. E. Shelby, "Handbook of Gas Diffusion in Solids and Melts", ASM International, 1996), the so called "interstitial diffusion". A complete description of the nature of the interstitials and their number density in specific dielectrics may be found in the book written by J. E. Shelby.

In order for hydrogenous species to escape from the semiconductor/dielectric interface or to arrive at the interface by diffusion through the bulk of the dielectric (as in the case of radiation induced damage), they must use the interstitial "voids" or channels alluded to above. In the present invention it is proposed that the interstices in the dielectric can be blocked by the addition of some small atomic diameter inert gas, for example, He. The blockage of these sites will impede the diffusion of whatever species either away from the semiconductor/dielectric interface or towards it through the bulk of the dielectric. The blockage of the interstitial sites will not only restrict the out-diffusion of hydrogenous species following bond breaking, but it will minimize the probability of the encounter of mono-atomic hydrogenous species followed by their dimerization. Such a minimization will enhance the probability that the hydrogenous atom or ion will revisit the region of the interface where it can be "captured" by attachment to a free atomic bond associated with the semiconductor.

To accomplish this, a small atomic diameter inert gas is used to fill the largest possible number of interstitial sites in the dielectric. The most appropriate gas to fulfill this function would be He although Neon and Argon may also be employed albeit less efficiently in filling the smallest interstitials. Various routes to introduce this gas into the dielectric film may be envisaged. A few examples are: a) exposure of the dielectric to He or the desired inert gas under moderate or high pressure (a few to several thousand atmospheres); b) deposition of the dielectrics (spacers, gate dielectric and/or overlayer) using carrier gases containing high densities of the appropriate small atomic diameter inert gas; c) ion implantation of the inert gas species to a depth such that the implanted gas lies entirely within the thickness of the said dielectric; or d) deposition by ultrasonic jet injection of the inert gas into the dielectrics.

From the work of Shelby, it appears that a typical interstitial density in a dielectric such as $SiO_2$ may approach $10^{21}$ $cm^{-3}$. In consequence, the maximum density of inert gas atoms introduced into the dielectric should approach this number.

Because of the risk of out-diffusion of Helium and other inert gases at such high concentrations, barriers to the out diffusion of the gas may be required. This will depend upon the existing technology. For example, in a FET, technology already using $Si_3N_4$ spacers (FIG. 1) the spacers and gate electrode structure may be adequate to encapsulate the inert gas saturated dielectric alone. If this is not the case, possible routes to this end include overlaying diffusion barriers on the FET dielectric and gate electrode. An appropriate out-diffusion barrier may be composed of deposited $Si_3N_4$, such films may be obtained by conventional deposition methods using $SiH_4$ and $NH_3$ with or without He or another inert gas used as a carrier or dilution gas, for example, dilute $SiH_4$ in He. For the case of the dielectrics in the circuit which may be relevant primarily in radiation induced dielectric aging, the use of a simple dielectric out-diffusion barrier overlayer may be adequate.

In a further modification of the process, two inert gases may be introduced into the dielectric above the semiconductor surface (for example, Ar+He). The second gas should be chosen such that its diffusivity in the dielectric is limited at low temperature. In this way its concentration will remain stable at the low operational temperature at which the devices function. The second gas will therefore impede the out diffusion of the primary gas. For this to be realistic, the atomic diameter of the secondary gas atom must in general be larger than that of the primary gas (most probably He). The secondary inert gas may be introduced into the dielectric using one of the methods outlined above simultaneously or subsequently to the He.

Heating of the dielectric/device structure to temperatures up to 750° C. may be required to assist these deposition processes involving an inert gas, as in chemical vapor deposition, for example. Heating may be required to assist the diffusion if a secondary, larger atomic diameter inert gas is also used since the larger species do not diffuse as well as the smaller species. Helium may be diffused through thin diffuse barriers at high temperatures and thereafter remain "frozen" once the temperature is lowered.

The moderate to high pressure range encompasses a few atmospheres up to several thousand atmospheres and is dependent upon the structure into which one is diffusing the He. As in the case of temperature, a thin diffusion barrier layer can be penetrated by applying very high pressures. Once having crossed the barrier, the helium remains "locked in" when the pressure source is removed. A secondary blocking gas may be used instead of a diffusion barrier layer to stop to out-diffusion of the helium.

The invention claimed is:

1. A method of suppressing de-passivation aging of microelectronic circuits having dielectric/semiconductor interfaces, the method comprising: providing said microelectronic circuits of said dielectric/semiconductor interfaces, which dangling bonds present in said dielectric/semiconductor interfaces and in which said dangling bonds have been passivated by chemically combining said dangling bonds with hydrogen species during fabrication process of said microelectronic circuits to form a semiconductor-hydrogen species bonds, wherein said interface being subsequently subjected to the aging processes of electrical stress and/or radiation causing said semiconductor-hydrogen species bonds to be broken and thereby causing said hydrogen species to diffuse away from said interface via said interstitial channels of said dielectric; filling said interstitial channels of said dielectric with a small atomic diameter inert gas, and thereby suppressing said de-passivation aging by confining said hydrogen species at said interfaces by said filling of said interstitial channels with said small atomic diameter inert gas.

2. The method of claim 1, wherein said small atomic diameter inert gas is selected from a group consisting of He, Ne, or Ar.

3. The method of claim 1, wherein said filling said interstitial channels of said dielectric with said small atomic diameter inter gas further comprises a step of adding a diffusion barrier to said dielectric to encapsulate said inert gas filled dielectric to thereby minimize the out diffusion of said inert gas from said dielectric.

4. The method of claim 1, wherein said small atomic diameter inert gas is introduced into said interstitial channels of said dielectric during said fabrication process by ion implantation of said small atomic diameter inert gas to a depth such that the implanted gas lies entirely within the thickness of said dielectric.

5. The method of claim 1, wherein said small atomic diameter inert gas is introduced into the interstitial channels of said dielectric by ultrasonic jet injection of said gas into said dielectric.

6. The method of claim 1, wherein said small atomic diameter inert gas is introduced into the interstitial channels of said dielectric by exposing said dielectric to said inert gas at a pressure of from 2 to 2000 atmospheres after said fabrication process.

* * * * *